United States Patent
Xiong et al.

(10) Patent No.: US 9,497,059 B2
(45) Date of Patent: Nov. 15, 2016

(54) METHOD FOR PERFORMING PEAK CLIPPING TO MULTIPLE CARRIER WAVES AND DEVICE THEREOF

(71) Applicant: DATANG MOBILE COMMUNICATIONS EQUIPMENT CO., LTD, Beijing (CN)

(72) Inventors: Jun Xiong, Beijing (CN); Yanhui He, Beijing (CN); Huarong Sun, Beijing (CN); Tao Duan, Beijing (CN); Jieli Wang, Beijing (CN); Ce Wang, Beijing (CN)

(73) Assignee: DATANG MOBILE COMMUNICATIONS EQUIPMENT CO., LTD, Beijing (CN)

( * ) Notice: Subject to any disclaimer, the term of this patent is extended or adjusted under 35 U.S.C. 154(b) by 0 days.

(21) Appl. No.: 14/916,204

(22) PCT Filed: Aug. 28, 2014

(86) PCT No.: PCT/CN2014/085412
§ 371 (c)(1),
(2) Date: Mar. 3, 2016

(87) PCT Pub. No.: WO2015/032290
PCT Pub. Date: Mar. 12, 2015

(65) Prior Publication Data
US 2016/0212002 A1 Jul. 21, 2016

(30) Foreign Application Priority Data
Sep. 3, 2013 (CN) .......................... 2013 1 0395688

(51) Int. Cl.
*H04L 27/26* (2006.01)
*H04B 1/04* (2006.01)
*H04L 5/00* (2006.01)

(52) U.S. Cl.
CPC ......... *H04L 27/2623* (2013.01); *H04B 1/0475* (2013.01); *H04L 5/001* (2013.01); *H04L27/2614* (2013.01); *H04L 27/2626* (2013.01); *H04B 2001/045* (2013.01); *H04L 5/0092* (2013.01)

(58) Field of Classification Search
CPC .. H04L 27/2323; H04L 4/001; H04B 1/0475
See application file for complete search history.

(56) References Cited

U.S. PATENT DOCUMENTS

| 2007/0211786 | A1* | 9/2007 | Shattil | H04B 1/707 375/141 |
| 2008/0049868 | A1* | 2/2008 | Brobston | H03F 1/3247 375/297 |
| 2009/0110033 | A1* | 4/2009 | Shattil | H04B 1/7174 375/141 |
| 2014/0362950 | A1* | 12/2014 | Fehri | H04B 1/68 375/296 |

FOREIGN PATENT DOCUMENTS

| CN | 101257481 A | 9/2008 |
| CN | 101662450 A | 3/2010 |
| CN | 101938448 A | 1/2011 |
| CN | 103491045 A | 1/2014 |

\* cited by examiner

*Primary Examiner* — Jaison Joseph
(74) *Attorney, Agent, or Firm* — Gokalp Bayramoglu

(57) ABSTRACT

The disclosure discloses a method and device for performing peak clipping to multiple carrier waves, the method includes: according to carrier wave number of configured multiple carrier waves, signal bandwidth and occupied bandwidth of each carrier wave, obtaining total signal bandwidth and total occupied bandwidth of the corresponding carrier waves; according to the total signal bandwidth and the total occupied bandwidth of the multiple carrier waves, generating a digital filter with set order, and obtaining filter coefficient of the digital filter; taking the filter coefficient as a peak clipping coefficient and using the peak clipping coefficient to perform peak clipping to the peak-to-average ratio signals of the carrier waves. By the disclosure, the complexity of the generation of the peak clipping coefficient is simplified, the deterioration degree of EVM is reduced, and the distortion degree of signals is also reduced.

11 Claims, 7 Drawing Sheets

METHOD FOR PERFORMING PEAK CLIPPING TO MULTIPLE CARRIER WAVES AND DEVICE THEREOF

CROSS-REFERENCE TO RELATED APPLICATIONS

This application is a national stage of International Application No. PCT/CN2014085412, filed Aug. 28, 2014, which is based upon and claims priority to Chinese Patent Applications No. CN201310395688.3, filed Sep. 3, 2013, the entire contents of all of which are incorporated herein by reference.

FIELD OF TECHNOLOGY

The disclosure relates to the field of communication and, more particularly, to a method for processing multi-carrier wave peak clipping and device thereof.

BACKGROUND

With the development of communication technologies, 3G (3rd-Generation, the third generation mobile communication technology) technologies is widely used in wireless communication systems. At present, all 3G wireless communication systems use multiple carrier waves to achieve expansion of cells. In the multi-carrier wave cells, the multi-carrier wave signals that need to be transmitted perform linear superposition and combinations in the digital intermediate frequency section, and share a common set of transmitters to transmit, therefore, the transmitting end of the antenna appears higher PAR (Peak to Average Ratio) signals, and this requires the power amplifier to have larger linear regions, thus leading to lower efficiencies of the power amplifier, and then causing increased cost of the power amplifier. In view of the problems, in wireless communication systems, it usually adopts the peak clipping technology to reduce PAR of the signals which enter the power amplifier.

A conventional peak clipping mode includes: for a multi-carrier wave configuration, firstly, a prototype filter which matches the spectrum of a single carrier wave is designed, and according to the carrier wave frequency configuration, move the frequency domain of the prototype filter onto the center frequency point of each carrier wave, then add up to obtain a multi-carrier wave filter. Further, the prototype filter is set to be b(n), wherein, n=0, ..., N−1, and N is the length of the peak clipping coefficient, while the prototype filter b(n) is able to be pre-generated and pre-stored, and obtained from the firls function of Matlab and using kaiser Adding Windows. Set the generation of the multi-carrier wave peak clipping coefficient to h(n), wherein, n=0, ..., N−1, and N is the length of the peak clipping coefficient, and generate the multi-carrier wave peak clipping coefficient which meets the requirements of the carrier wave according to the carrier wave configuration frequency, and the generation method is as shown in the following formula:

$$h(n) = b(n) \sum_{k=1}^{I} e^{j2\pi(n-floor(\frac{N}{2}))f_i(k)/f_s}$$

In the formula above, the number of the carrier waves is I, $f_i(k)$ ($1 \le k \le 1$) is the $i^{th}$ carrier wave frequency, $f_s$ is the sampling frequency, and floor indicates rounding down.

After the peak clipping coefficient is generated through the above process, it is capable to use the peak clipping coefficient to perform the peak clipping process on the multi-carrier wave signals.

However, the peak clipping coefficient obtained in this way is too complex, and each peak clipping coefficient is obtained by adding up multiple basic prototype coefficients, making EVM (Error Vector Magnitude) of the signal increased after the peak clipping. Especially, in the conventional technologies, with the increment of number of earlier waves and the expanding of frequency band, the system bandwidth needed is wider and wider, and at that moment, the added up prototype coefficients are more, the calculation of the peak clipping coefficient is also more complex, thus making EVM of the signal even more serious after the peak clipping, and then causing the signal distortion more serious.

SUMMARY OF THE INVENTION

The disclosure provides a method and device for performing peak clipping to multiple carrier waves, in order to solve the problems that the conventional calculation of the peak clipping is complex, EVM of the signal is serious after the peak clipping, and the signal distortion is serious.

In order to solve the above problems, the disclosure discloses a method for performing peak clipping to multiple carrier waves, comprising:

according to carrier wave number of configured multiple carrier waves, signal bandwidth and occupied bandwidth of each carrier wave, obtaining total signal bandwidth and total occupied bandwidth of the corresponding carrier waves;

according to the total signal bandwidth and the total occupied bandwidth of the multiple carrier waves, generating a digital filter with set order, and obtaining filter coefficient of the digital filter;

taking the filter coefficient as a peak clipping coefficient, and using the peak clipping coefficient to perform peak clipping to the peak-to-average ratio signals of the carrier waves.

Preferably, the step of according to the total signal bandwidth and the total occupied bandwidth of the multiple carrier waves, generating a digital filter with set order, and obtaining filter coefficient of the digital filter comprises:

taking quotient of the total signal bandwidth of the carrier waves divided by the sampling frequency as the left frequency point of the digital filter, and taking the quotient of the total occupied bandwidth of the carrier waves divided by the sampling frequency as the right frequency point of the digital filter;

according to the left frequency point and the right frequency point, generating the digital filter with set order.

Preferably, the step of according to the left frequency point and the right frequency point, generating the digital filter with set order comprises:

using the first reduction coefficient to perform narrowing on the left frequency point and using the second reduction coefficient to perform narrowing on the right frequency point, respectively, to make the peak clipping noise bandwidth defined by the left frequency point and the right frequency point less than actual bandwidth;

according to the narrowed left frequency point and the right frequency point, generating the digital filter with set order.

Preferably, the step of according to the left frequency point and the right frequency point, generating the digital filter with set order comprises:

taking the left frequency point, the right frequency point, and the set order as parameters, and using firls function to generate finite impulse response (FIR) filer with set order.

Preferably, the step of obtaining the filter coefficient of the digital filter comprises:

using kaiser window function to modify the generated FIR filter, and obtaining the filter coefficient of the modified digital filter.

In order to solve the problem above, the disclosure also discloses a device or performing peak clipping to multiple carrier waves, comprising:

a first obtaining module, configured to, according to carrier wave number of configured multiple carrier waves, signal bandwidth and occupied bandwidth of each carrier wave, obtain total signal bandwidth and the total occupied bandwidth of the corresponding carrier waves;

a second obtaining module, configured to, according to the total signal bandwidth and the total occupied bandwidth of the multiple carrier waves, generate a digital filter with set order, and obtain filter coefficient of the digital filter;

peak clipping processing module, configured to take the filter coefficient as a peak clipping coefficient, and use the peak clipping coefficient to perform peak clipping to the peak-to-average ratio signals of the carrier waves.

Preferably, when the second obtaining module generates a digital filter with set order, and obtains filter coefficient, of the digital filter according to the total signal bandwidth and the total occupied bandwidth of the multiple carrier waves, the second obtaining module takes quotient of the total signal bandwidth of the carrier waves divided by the sampling frequency as the left frequency point of the digital filter, and taking the quotient of the total occupied bandwidth of the carrier waves divided by the sampling frequency as the right frequency point of the digital filter; and the second obtaining module generates the digital filter with set order according to the left frequency point and the right frequency point.

Preferably, when the second obtaining module generates the digital filter with set order according to the left frequency point and the right frequency point, the second obtaining module uses the first reduction coefficient to perform narrowing on the left frequency point and using the second reduction coefficient to perform narrowing on the right frequency point, respectively, to make the peak clipping noise bandwidth defined by the left frequency point and the right frequency point less than actual bandwidth; and the second obtaining module generates the digital filter with set order according to the narrowed left frequency point and the right frequency point.

Preferably, when the second obtaining module generates the digital filter with set order according to the left frequency point and the right frequency point, the second obtaining module takes the left frequency point, the right frequency point, and the set order as parameters, and uses firls function to generate finite impulse response (FIR) filter with set order.

Preferably, when the second obtaining module obtains the filter coefficient of the digital filter, the second obtaining module uses kaiser window function to modify the generated FIR filter, and obtains the filter coefficient of the modified digital filter.

In order to solve the problem above, the disclosure further discloses a computer program, comprising computer readable codes, wherein when the computer readable codes are carried out on a server, the server executes the method for performing peak clipping to multiple carrier waves above.

In order to solve the problem above, the disclosure further discloses a computer readable medium, in which the computer program as above is stored.

Compared with the prior art, the disclosure has the following advantages:

The disclosure is designed directing at the maximum bandwidth of the configured multiple carrier waves, and according to the total signal bandwidth and the total occupied bandwidth of the carrier waves, generates a digital filter with set order, and then takes the filter coefficient of the digital filter as the peak clipping coefficient, and performs the peak clipping of the peak-to-average ratio signals to the carrier waves. For the multiple groups of multiple carrier waves, if the bandwidth defined by left frequency point and right frequency point of one group of multiple carrier waves is the same with that of another one or more groups of multiple carrier waves, then all of them may use the same peak clipping coefficient to perform the peak clipping on its peak-to-average ratio signals, and it is not necessary to pay attention to the multi-carrier wave within this group is TD carrier wave, or LTE carrier wave, or the mixture of the two. By the disclosure, adopting a single peak clipping coefficient when multiple carrier waves are synthesized, which simplifies the complexity of generating the peak clipping coefficient, reduces the deterioration degree of EVM, and also reduces the distortion degree of signals.

DETAILED DESCRIPTION OF THE INVENTION

In order to make the objective, characteristics and advantages of the disclosure more apparent, hereinafter, the disclosure is illustrated more specifically in accompanying with the drawings and description.

The First Embodiment

Figure 1:
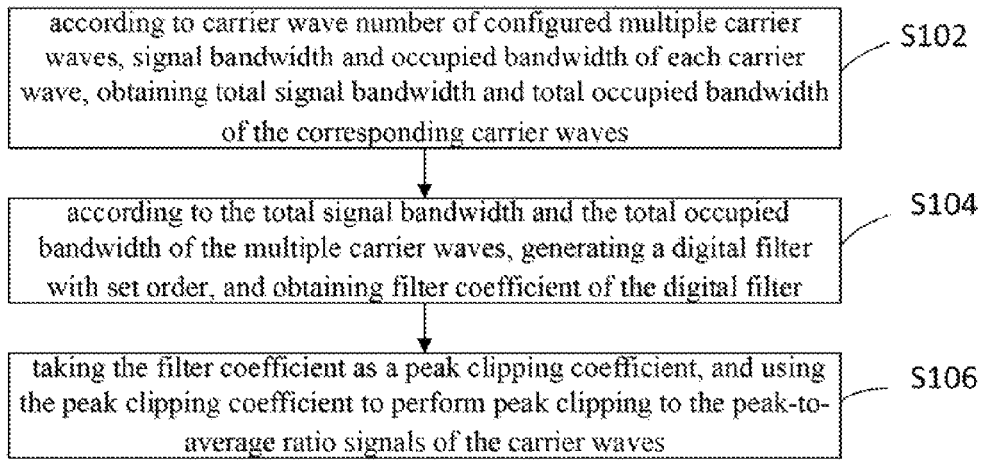
FIG. 1 is a flowchart showing steps of a method for performing peak clipping to multiple carrier waves according to the first embodiment of the disclosure.

With reference to FIG. 1, it shows is a flowchart showing steps of a method for performing peak clipping to multiple carrier waves according to the first embodiment of the disclosure.

The method for performing peak clipping to multiple carrier waves includes the steps of:

Step S102, according to carrier wave number of configured multiple carrier waves, signal bandwidth and occupied bandwidth of each carrier wave, obtaining total signal bandwidth and total occupied bandwidth of the corresponding carrier waves;

The signal bandwidth refers to the width of signal frequency spectrum, that is, the difference between the maximum frequency component and the minimum frequency component, the occupied bandwidth is the occupied bandwidth of the energy (power) transmitted from the channel.

Step S104, according to the total signal bandwidth and the total occupied bandwidth of the multiple carrier waves, generating a digital filter with set order, and obtaining filter coefficient of the digital filter;

Currently, there are many ways to generate digital filter with set order, such as fir1 function, fir2 function, firls function, remez function and so on. Using total signal bandwidth and total occupied bandwidth of multiple carrier waves to replace corresponding parameters in the above functions, it is capable to generate digital filter specific to the total bandwidth of the carrier waves. After the digital filter is generated, the filter coefficient of the digital filter is determined.

Step S106, taking the filter coefficient as a peak clipping coefficient, and using the peak clipping coefficient to perform peak clipping to the peak-to-average ratio signals of the carrier waves.

Using the peak clipping coefficient to perform peak clipping to the peak-to-average ratio signals of the carrier waves may be achieved by a skilled person in the art with reference to the related peak clipping technology, and it is not illustrated herein for concise.

The embodiment of the disclosure is designed directing at the maximum bandwidth of the configured multiple carrier waves, and according to the total signal bandwidth and the total occupied bandwidth of the carrier waves, generates a digital filter with set order, and then takes the filter coefficient of the digital filter as the peak clipping coefficient, and performs the peak clipping of the peak-to-average ratio signals to the carrier waves. For the multiple groups of multiple carrier waves, if the bandwidth defined by left frequency point and right frequency point of one group of multiple carrier waves is the same with that of another one or more groups of multiple carrier waves, then all of them may use the same peak clipping coefficient to perform the peak clipping on its peak-to-average ratio signals, and it is not necessary to pay attention to the multi-carrier wave within this group is TD carrier wave, or LTE carrier wave, or the mixture of the two. By the disclosure, adopting a single peak clipping coefficient when multiple carrier waves are synthesized, which simplifies the complexity of generating the peak clipping coefficient, reduces the deterioration degree of EVM, and also reduces the distortion degree of signals.

The Second Embodiment

Figure 2:
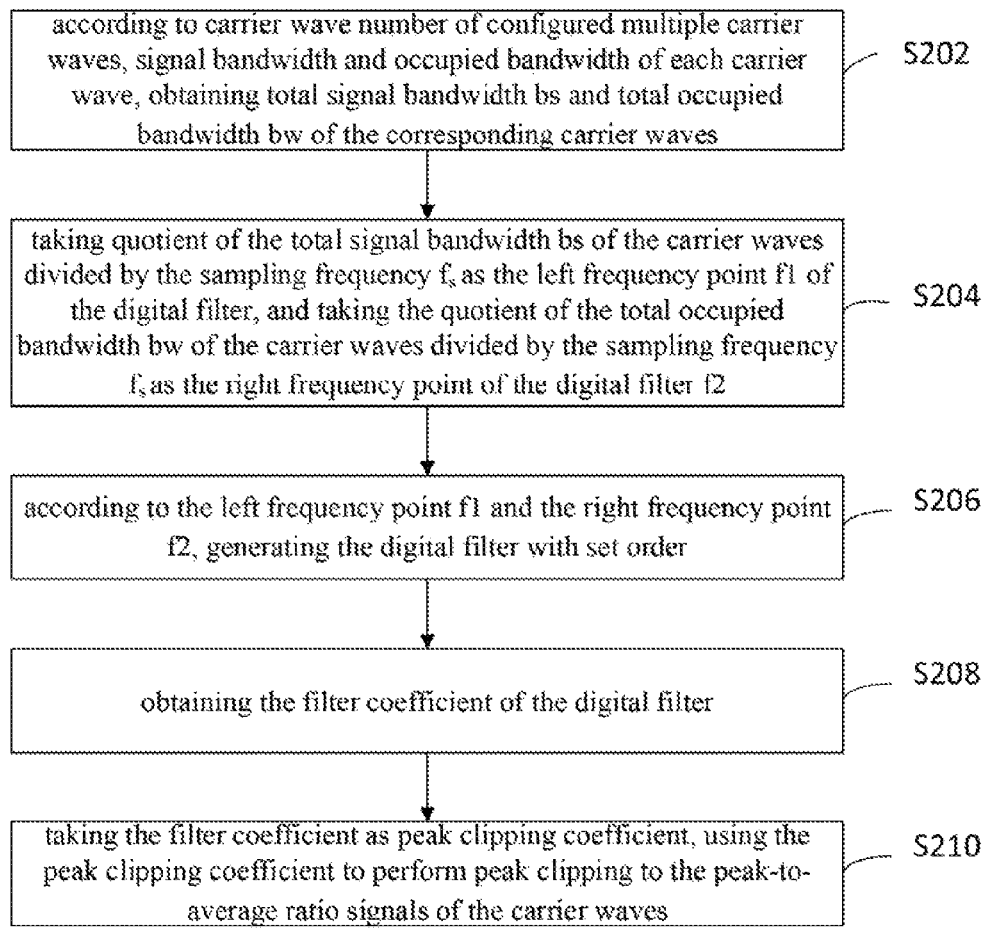
FIG. 2 is a flowchart showing steps of a method for performing peak clipping to multiple carrier waves according to the second embodiment of the disclosure.

As shown in FIG. 2, it is a flowchart showing steps of a method for performing peak clipping to multiple carrier waves according to the second embodiment of the disclosure;

The method for performing peak clipping to multiple carrier waves in the embodiment may include the following steps:

Step S202, according to carrier wave number of configured multiple carrier waves, signal bandwidth and occupied bandwidth of each carrier wave, obtaining total signal bandwidth bs and total occupied bandwidth bw of the corresponding carrier waves;

Step S204, taking quotient of the total signal bandwidth bs of the carrier waves divided by the sampling frequency $f_s$ as the left frequency point f1 of the digital filter, and taking the quotient of the total occupied bandwidth bw of the carrier waves divided by the sampling frequency $f_s$ as the right frequency point of the digital filter f2;

That is, $$f1 = \frac{bs}{fs}; f2 = \frac{bw}{fs}.$$

Step S206, according to the left frequency point f1 and the right frequency point f2, generating the digital filter with set order.

In the embodiment, it is set to use the IMs function to generate FIR (finite impulse response) filter. Then, preferably, in the step, taking the left frequency point, the right frequency point, and the set order as parameters, and using firls function to generate FIR filter with set order. The firls function uses least square method to achieve a minimum error between expected frequency response and actual frequency response, thusly the generated FIR filter may require actual application requirement in a larger extent.

Preferably, it is capable to use kaiser window function to modify the generated FIR filter, and obtaining the filter coefficient of the modified digital filter.

Theoretically, the frequency spectrum of the peak clipping coefficient should match the frequency spectrum of the input signal. However, actually, in order to prevent peak clipping noise from deteriorating adjacent channel power ratio (ACPR), the input peak clipping noise bandwidth should be narrower than the signal bandwidth, that is, the left frequency point f1 and the right frequency point f2 may be narrowed, in the following manner;

$$f1 = \frac{bs*shrinks}{fs}, f2 = \frac{bw*shrinkw}{fs}$$

Wherein the shrinks and the shrinkw may be between 0.9 to 1.1, usually around 0.9, thusly, to a LTE system with physical layer rate 122.88 MHz and signal transmitting bandwidth 20 MHz, the bs=18, bw=20, that is, $$f1 = \frac{17}{122.88}, f2\frac{19}{122.88}.$$

From the above, it is obtained, during generating the digital filter with set order according to the left frequency point f1 and the right frequency point f2, preferably, it is capable to use the first reduction coefficient such as shrinks to perform narrowing on the left frequency point f1 and using the second reduction coefficient shrinkw to perform narrowing on the right frequency point f2, respectively, to make the peak clipping noise bandwidth defined by the left frequency point f1 and the right frequency point f2 less than actual bandwidth; then, generate the digital filter with set order according to the narrowed left frequency point and the right frequency point.

Step S208, obtaining the filter coefficient of the digital filter;

Step S210, taking the filter coefficient as peak clipping coefficient, using the peak clipping coefficient to perform peak clipping to the peak-to-average ratio signals of the carrier waves.

To sum up, to the total bandwidth (including occupied bandwidth and signal bandwidth) of multiple carrier waves, the peak clipping coefficient is as follows:

$$h_B(k)=\text{filter\_}f(k), k=0, 1, \ldots, N-1$$

wherein $h_B(k)$ is a single peak clipping coefficient of multiple carrier waves, filter_f(k) includes the total bandwidth of multiple carrier waves, filter_f(k) is used to represent to coefficient of multiple carrier waves, N represents length of the peak clipping coefficient.

Wherein,

A generating way of a filter filter_f is to invoke a firls function with format of b=firls(n,f,m), the function returns a linear phase FIR filter with (n+1) length (since the generated digital filter may be directly represented by the generated filter coefficient, b also represents the filter coefficient of the filter generated by the firls function), wherein n represents filter order, f represents frequency vector standard frequency with filter expected frequency characteristic, which is ranged from 0 to 1, and is an incremental vector, and is allowed to define repeat frequency point; m represents an amplitude vector of the filter expected frequency characteristic; m and f have the same length and should be even number.

Preferably, based on generating FIR filter by invoking firls function with format of b=firls(n,f,m) it is also capable to generate FIR filter by invoking firls function with format of b=firls(n,f,m,w), wherein the meanings of b, n, f and m may be the same as illustrated above, w represents weighting, in order to indicate the weight of minimum integral of squared error of one frequency band corresponding to other frequency bands.

In the embodiment, the process of invoking firls function with format of b=firls(n,f,m) to generate the FIR filter is:

filter_$f$=firls(cfr_taps−1, [0 $f1$ $f2$ 1], [1 1 0 0], [1 10])×kaiser(cfr_taps, 5)

wherein the invoking format of kaiser function is p=kaiser (n, beta), n represents length of kaiser window, beta presents β parameter which affecting Window function sidelobe (it should be noted, in the embodiment β parameter may be 5, but in practical application, a skilled person in the art may set according to actual requirement), p represent the generated kaiser window. Via the kaiser function, it is capable to modify the filter generated by the firls function.

In the generating formula of the filter filter_f, cfr_taps represents the length of peak clipping coefficient, the length of peak clipping coefficient cfr_taps may be determined according to hardware resource, generally 511 or 255 orders. F1 represent left frequency point of the carrier waves, f2 represents right frequency point of the carrier waves, $$f1 = \frac{bs}{fs}, f2 = \frac{bw}{fs},$$

bs represents total occupied bandwidth of multiple carrier waves, $f_s$ represents sampling frequency. Similarly, in order to prevent peak clipping noise from deteriorate the ACPR of system, f1 and f2 may be narrowed, to make the input peak clipping noise bandwidth narrower than the signal bandwidth, that is, $$f1 = \frac{bs*shrinks}{fs}, f2 = \frac{bw*shrinkw}{fs},$$

shrinks represents the first reduction coefficient, shrinkw represents the second reduction coefficient, shrinks and shrinkw may be between 0.0 to 1.1, and usually around 0.9.

As shown in the above process, after performing peak clipping with single peak clipping coefficient to the multiple carrier waves, the peak clipping coefficient does not have multi-carrier wave superposing problem, this simplifies generating complexity of peak clipping coefficient, reduces the deterioration degree of EVM, and also reduces the distortion degree of signals. The peak clipping coefficient is basically determined after the cell is established, the frequency spectrum of the peak clipping coefficient does not change even when the user number reduces or carrier wave number reduces or increases, thusly the peak clipping coefficient is both flexible and stable.

Hereinafter, an example is used to illustrate the peak clipping process to multiple carrier waves.

Supposing, specific to a total bandwidth different carrier waves, the set filter coefficient of multiple carrier wave is shown in the table below

| CFRprototype filter | Adapted situation |
|---|---|
| 30M_CFR coefficient | 20MLTE + TD6C, 20MLTE + 10MLTE, 15MLTE + 15MLTE |
| 35M_CFR coefficient | 20MLTE + 15MLTE, 20MLTE + 10MLTE + TD3C |
| 40M_CFR coefficient | 20MLTE + 20MLTE |
| 50M_CFR coefficient | 20MLTE + 20MLTE + 10MLTE, 20MLTE + 20MLTE + TD6C |

It can be seen as above, a group of generated peak clipping coefficient, which may be the peak clipping coefficient have the bandwidth of 30 MHZ, may be used in TD or LTE, or the mixture thereof, if only the bandwidth and speed are matched.

Hereinafter, an example is taken to illustrate how the peak clipping coefficient is optimized and united under the condition of multiple kinds of carrier waves.

1) The number of TD carrier wave with F,A frequency band have six configurations which are 1, 2, 3, 4, 5 and 6, the peak clipping coefficients may also be set according the six configurations, which may be set as (1.6000 3.2000 4.8000 6.4000 8.0000 9.6000), for example, the system distributed six continuous carrier waves, the peak clipping coefficient only uses a 9.6 MHZ peak clipping coefficient.

2) F-LTE-20 MHZ and F-TD-10 MHZ are distributed continuously, only a (LTE+TD) 30 MHZ peak clipping coefficient may be used.

3) if the distribution of LTE and TD are not continuous frequency band distribution, or the TD is not full configuration, the configuration is free according to the frequency points of the TD and LTE.

4) although F-LTE and F-TD are not distributed continuously, the distance between the frequency points are less than 1.6 MHZ, it is also used as continuous distribution, thusly the peak clipping coefficient is convenient in use and have better effect.

5) When the peak clipping is performed on the F-LTE and F-TD, if T-TD is less than two carrier waves, the peak clipping coefficient of TD is nor configured, only the peak clipping coefficient of F-LTE is used to perform peak clipping.

Figure 3:
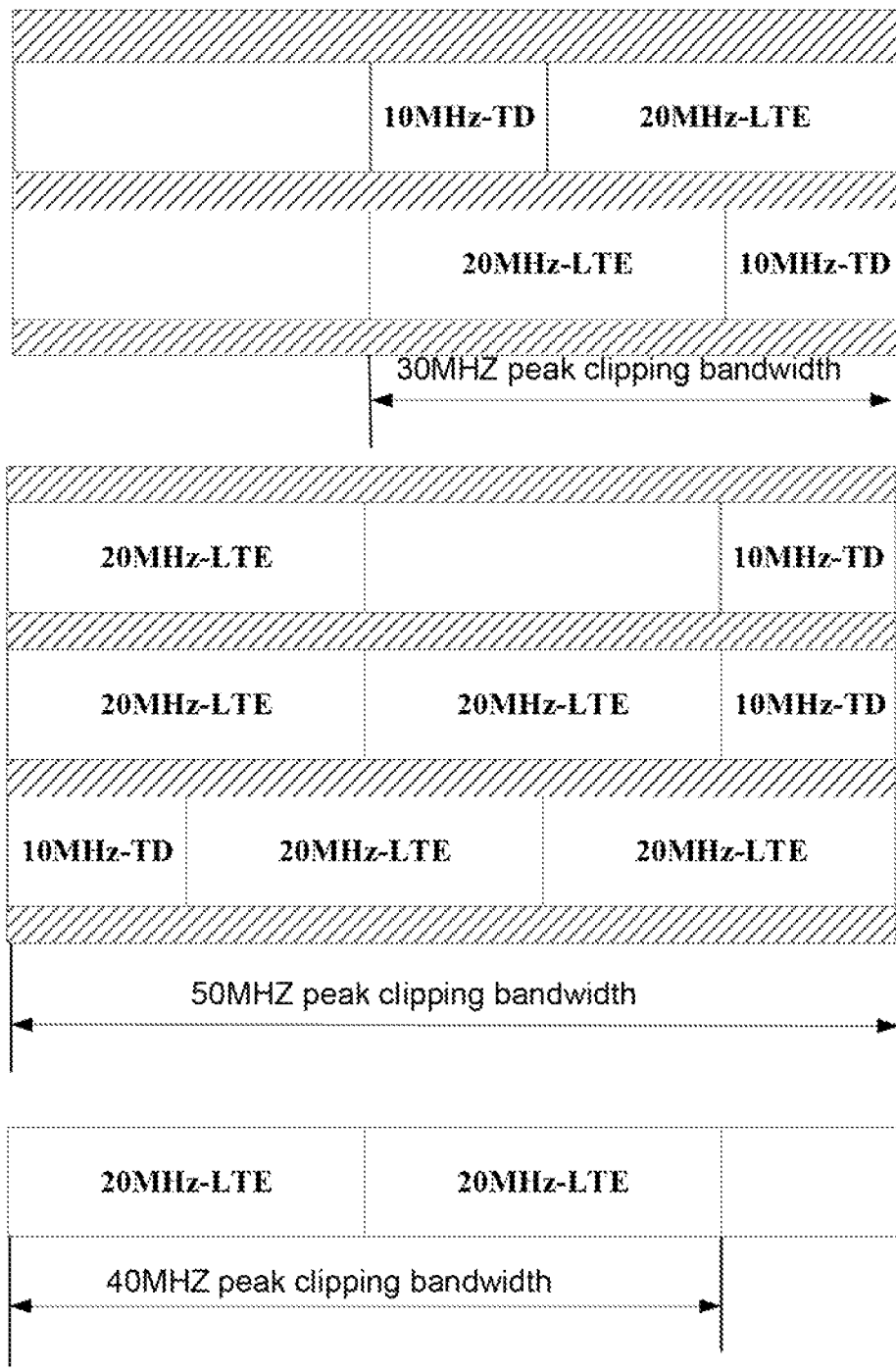
FIG. 3 is a schematic diagram showing multiple groups of the multiple earlier waves which have different bandwidths of peak clipping in the embodiment illustrated in FIG. 2.

Further, for example, if specific to the configuration system with continuous multiple carrier waves, according to the established cell information, the bandwidth of peak clipping coefficient may be 40 MHZ, 30 MHZ, 50 MHZ, as shown in FIG. 3, respectively, although the carrier waves have different configuration, as long as the configuration of bandwidth of peak clipping coefficient and total bandwidth of signal are the same, the same group of peak clipping coefficient may be used.

Figure 6:
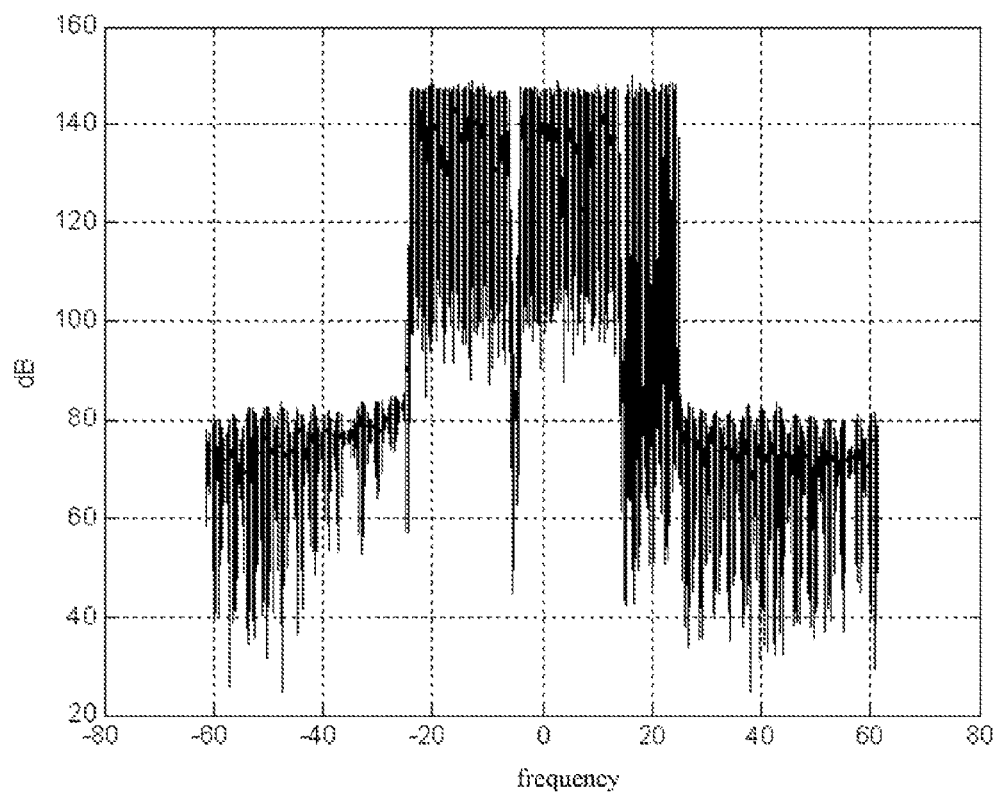
FIG. 6 is a schematic diagram showing the original signal of the 50 MHZ hybrid multiple carrier waves of TD and LTE.
Figure 7:
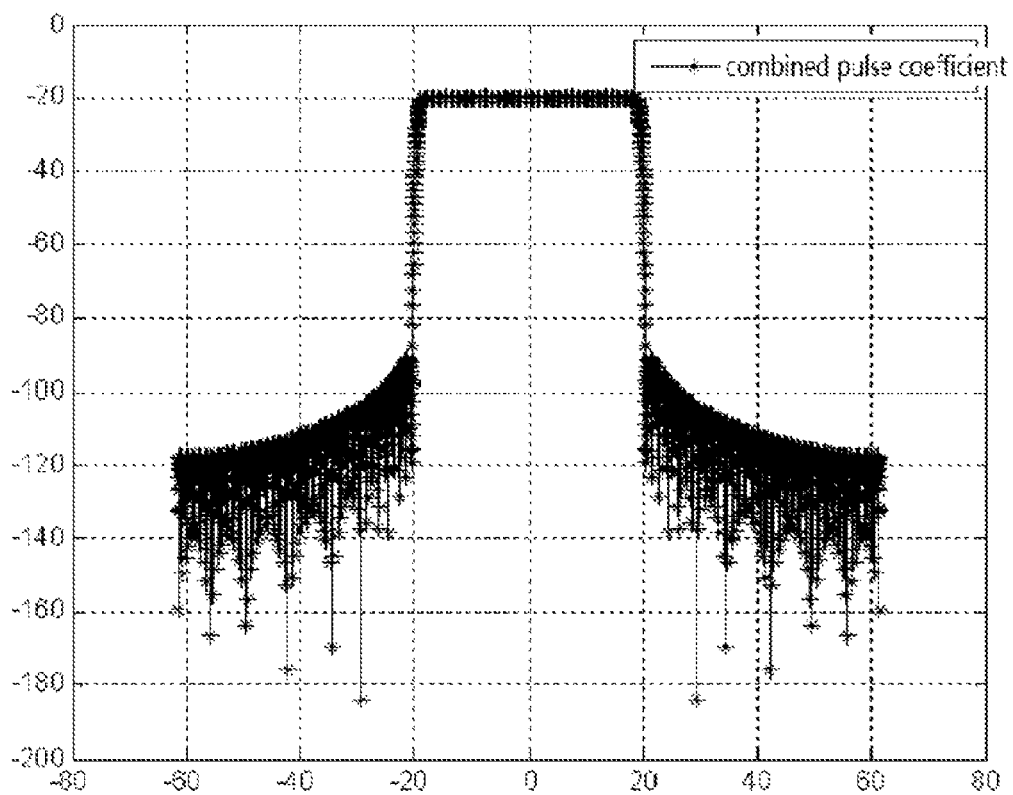
FIG. 7 is a frequency spectrogram of the single peak clipping coefficient of the multi-carrier wave illustrated in FIG. 6.
Figure 8:
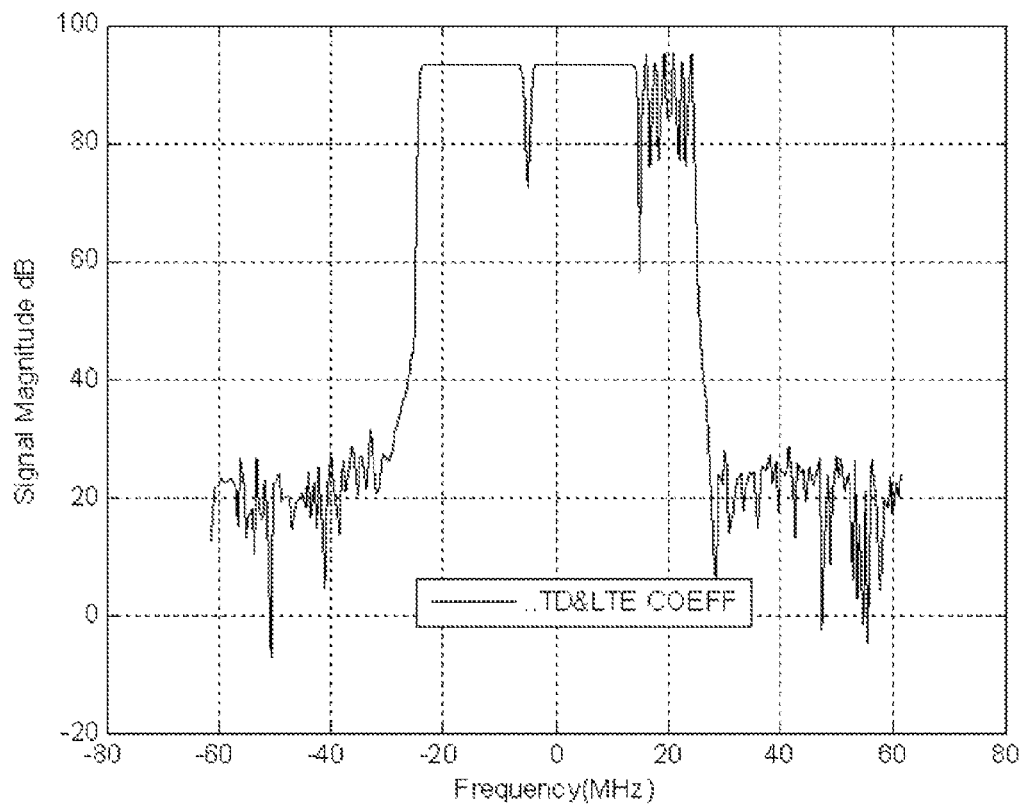
FIG. 8 is a frequency spectrogram of the combinatorial peak clipping coefficient of the multi-carrier wave illustrated in FIG. 6.

Further, for example, in the following, three carrier wave signals under 50 MHZ LTE+TD are established, in certain time, the middle carrier wave signal have no information, the original signal is shown in FIG. 6, the peak clipping coefficient does not change at that moment, specific to this kind of signal, a single peak clipping coefficient may be adopted, the frequency spectrum of single peak clipping coefficient may be shown in FIG. 7. Compared with conventional frequency spec train using combined peak clipping coefficient (as shown in FIG. 8), the peak clipping processing effect may be shown in the table below (the CCDF represents inverse cumulative probability distribution):

| Peak clipping coefficient configuration | algorithmic programsetting target PAR | First carrier wave EVM | Second carrier wave EVM | Third carrier wave EVM | Obtained CCDF by test |
|---|---|---|---|---|---|
| Single coefficient | 6.9 | 4.2 | 4.4 | 3.5 | 7.35 |
| Combined coefficient | 6.9 | 4.4 | 4.6 | 3.9 | 7.4 |

According to the above table, after performing peak clipping using single coefficient, the peak clipping processing using single peak clipping coefficient may improve EVM partly compared with using combined coefficient.

Figure 4:
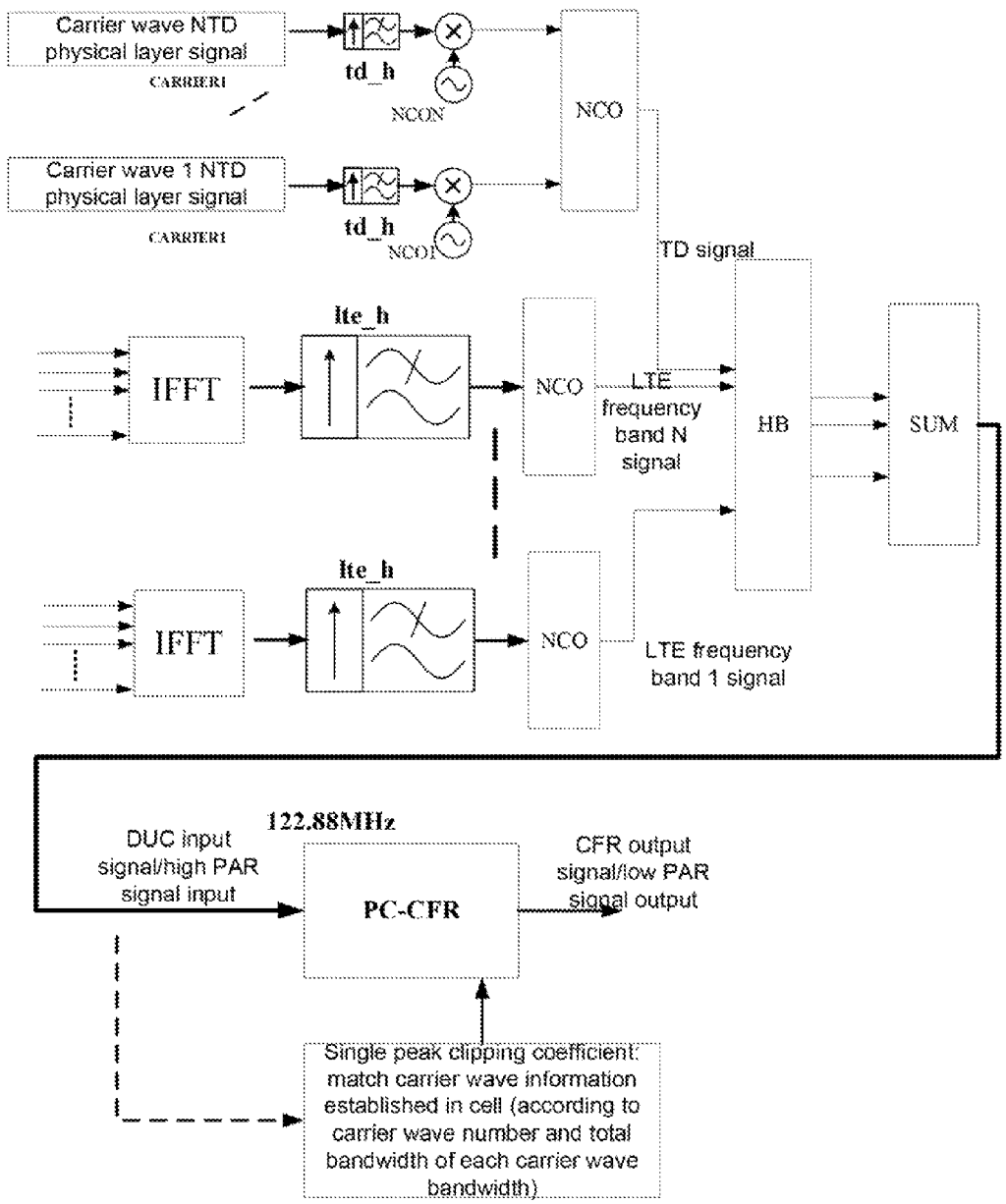
FIG. 4 is a schematic diagram showing the application of the method for performing peak clipping to multiple carrier waves illustrated in FIG. 2.

In the following part, the peak clipping processing to multiple carrier wave in the embodiment may be illustrated herein concisely. As shown in FIG. 4, the application have both TD carrier wave, and LTE carrier wave. In one aspect, multiple TD carrier wave generates a combined TD signal after the processing of interpolation filtering of td_h and the numerically controlled oscillator (NCO). In another aspect, multiple LTE carrier wave which are processed by inverse fast Fourier transform (IFFT) generates multiplex-processed LTE frequency band signal after the processing of interpolation filtering of td_h and the numerically controlled oscillator (NCO). The combined TD signal and multiplex-processed LTE signal is processed by SUM process (multicarrier stack processing) after they are roughly filtered by HB filter. After that, peak cancellation crest factor reduction (PC-CFR) is performed. The signal peak clipping coefficient specific to multiple carrier wave makes its effect on PC-CFR, that is according to single peak clipping coefficient, the PC-CFR is performed, and is output at last. That is, the digital up converter (DUC) performed after SUM process inputs a signal or high PAR inputs signal, the PC-CFR process is performed according to single peak clipping coefficient, and output CFR output, signal/low PAR output signal.

Figure 5:
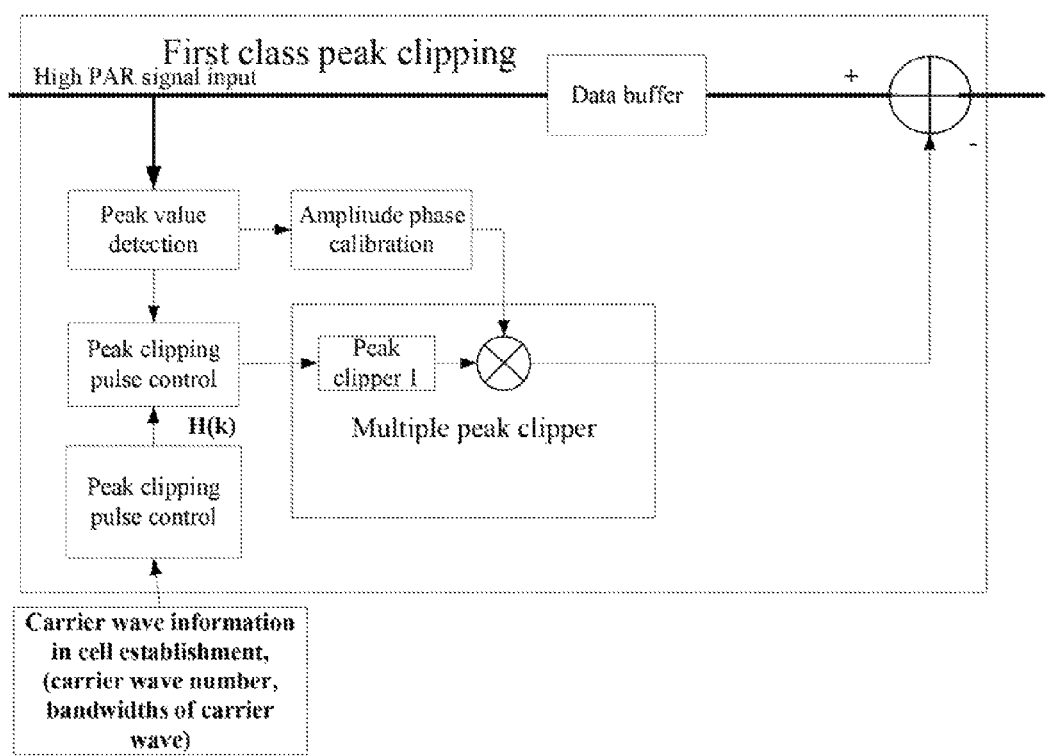
FIG. 5 is a schematic diagram showing the method for performing peak clipping to multiple carrier waves in the application illustrated in FIG. 4.

With reference to FIG. 5, it is further illustrated specific to DUC input signal/high PAR input signal, performing PC-CFR processing according to single peak clipping coefficient, outputting CFR output signal/low PAR output signal.

In FIG. 5, high PAR input signal is taken as an example, DUC input signal may be referred to high PAR input signal.

In FIG. 5, after high PAR signal is inputted, the data is buffered, when the original input data sign bit is not changed, the peak value is detected. Then, in one aspect, a peak clipping pulse control is performed on the signal after peak value detection is performed by the generated multiple carrier wave single peak clipping coefficient, wherein as stated above, the single peak clipping coefficient may establish carrier wave information according to cell, including the carrier wave number and bandwidth generation of each earlier wave, the signal after peak clipping pulse control enters peak clipper; in another aspect, the signal after peak clipping pulse control is performed by amplitude phase calibration in peak value point. At last, the signal is output, after peak clipping processing.

By the processes above, 1) no matter transmitting TD-SCDMSA narrow band carrier wave signal or LTE-TDD wide frequency band signal, during carrier wave combination, a single peak clipping coefficient is used, which simplifies the complexity of coefficient generation; 2), specific to different carrier wave number configuration or different bandwidth, the peak clipping bandwidth can be adjusted adaptively, the set of the peak clipping coefficient bandwidth and the establishment of cell is the corresponding carrier waves, the correspondence of frequency points and carrier wave number, after that, even if real-time user number reduces or carrier wave number reduces, the frequency spectrum of peak clipping coefficient is not changed any more, thusly, the peak clipping coefficient is both flexible and stable; 3) the stopband rejection of the combined peak clipping coefficient is usually between 35~40 dBc, which satisfies the composite requirement of system ACPR, EVM, and CCDF, and has the advantage of reducing EVM deterioration compared with conventional peak clipping coefficient; the combined peak clipping coefficient having relatively lower stopband rejection makes peak clipping even distributed in the whole frequency band, which reduces noise of useful signal frequency band.

By the embodiment, a method for performing peak clipping to multiple carrier waves is disclosed specific to bandwidth of multiple carrier wave, wherein the peak clipping coefficient may satisfy the requirement from the system under different bandwidth to peak clipping performance, solves the problem in the conventional technology that the PAR is over large during multiple carrier wave superposing, and too many prototype coefficient is superposed, simplifies the generating process of peak clipping coefficient, reduces the deteriorate degree of EVM, and satisfies the requirement of ACPR, EVM and CCDF.

The Third Embodiment

Figure 9:
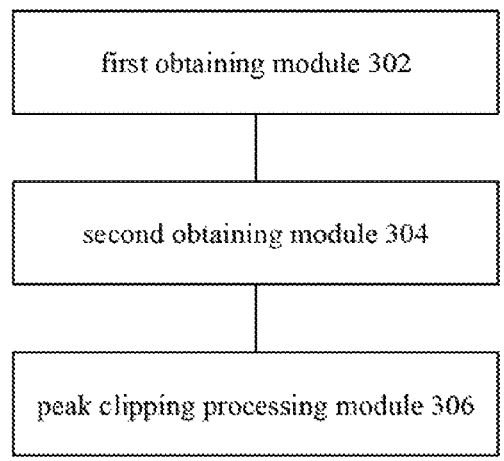
FIG. 9 is a block diagram showing the structure of a device for processing peak clipping to multiple carrier waves according to the third embodiment of the disclosure.

As shown in FIG. 9, it is a block diagram showing the structure of a device for processing peak clipping to multiple carrier waves according to the third embodiment of the disclosure.

The device for processing peak clipping to multiple carrier waves includes:

a first obtaining module 302, configured to, according to carrier wave number of configured multiple carrier waves, signal bandwidth and occupied bandwidth of each carrier wave, obtain total signal, bandwidth and the total occupied bandwidth of the corresponding carrier waves;

a second obtaining module 304, configured to, according to the total signal bandwidth and the total occupied bandwidth of the multiple carrier waves, generate a digital filter with set order, and obtain filter coefficient of the digital filter;

a peak clipping processing module 306, configured to take the filter coefficient as a peak clipping coefficient, and use the peak clipping coefficient to perform peak clipping to the peak-to-average ratio signals of the carrier waves.

The embodiment of the disclosure is designed directing at the maximum bandwidth of the configured multiple carrier waves, and according to the total signal bandwidth and the total occupied bandwidth of the carrier waves, generates a digital filter with set order, and then takes the filter coefficient of the digital filter as the peak clipping coefficient, and performs the peak clipping of the peak-to-average ratio signals to the carrier waves. For the multiple groups of multiple carrier waves, if the bandwidth defined by left frequency point and right frequency point of one group of multiple carrier waves is the same with that of another one or more groups of multiple carrier waves, then all of them may use the same peak clipping coefficient to perform the peak clipping on its peak-to-average ratio signals, and it is not necessary to pay attention to the multi-carrier wave within this group is TD carrier wave, or LTE carrier wave, or the mixture of the two. By the disclosure, adopting a single peak clipping coefficient when multiple carrier waves are synthesized, which simplifies the complexity of generating the peak clipping coefficient, reduces the deterioration degree of EVM, and also reduces the distortion degree of signals.

The Fourth Embodiment

Referring to FIG. 9 again, in the current embodiment, the third embodiment is optimized, the optimized multiple carrier wave peak clipping device includes: a first obtaining module 302, configured to, according to carrier wave number of configured multiple carrier waves, signal bandwidth and occupied bandwidth of each carrier wave, obtain total signal bandwidth and the total occupied bandwidth of the corresponding carrier waves; a second obtaining module 304, configured to, according to the total signal bandwidth and the total occupied bandwidth of the multiple carrier waves, generate a digital filter with set order, and obtain filter coefficient of the digital filter; a peak clipping processing module 306, configured to take the filter coefficient as a peak clipping coefficient, and use the peak clipping coefficient to perform peak clipping to the peak-to-average ratio signals of the carrier waves.

Preferably, when the second obtaining module 304 generates a digital filter with set order according to the total signal bandwidth and the total occupied bandwidth of the multiple carrier waves, it takes quotient of the total signal bandwidth of the carrier waves divided by the sampling frequency as the left frequency point of the digital filter, and taking the quotient of the total occupied bandwidth of the carrier waves divided by the sampling frequency as the right frequency point of the digital filter; and generates the digital filter with set order according to the left frequency point and the right frequency point.

Preferably, when the second obtaining module 304 generates the digital filter with set order according to the left frequency point and the right frequency point, it uses the first reduction coefficient to perform narrowing on the left frequency point and using the second reduction coefficient to perform narrowing on the right frequency point, respectively, to make the peak clipping noise bandwidth defined by the left frequency point and the right frequency point less than actual bandwidth; and generates the digital filter with set order according to the narrowed left frequency point and the right frequency point.

Preferably, when the second obtaining module 304 generates the digital filter with set order according to the left frequency point and the right frequency point, it takes the left frequency point, the right frequency point, and the set order as parameters, and uses firls function to generate finite impulse response (FIR) filter with set order.

Preferably, when the second obtaining module 304 obtains the filter coefficient of the digital filter, it uses kaiser window function to modify the generated FIR filter, and obtains the filter coefficient of the modified digital filter.

The device or performing peak clipping to multiple carrier waves in the embodiment is used to realize the method or performing peak clipping to multiple carrier waves in the above embodiments, and has the beneficial effects of the corresponding method embodiments, which is not illustrated herein for concise purpose.

It should be noted that, the embodiment of the disclosure further discloses computer program, comprising computer readable codes, wherein when the computer readable codes are carried out on a server, the server executes the method for performing peak clipping to multiple carrier waves according to any one the embodiments above.

In addition, the embodiment of the disclosure further disclose a medium which stores the computer program. The medium includes but not limited as mechanisms such as computer readable storage or information transmission ways. For example, the medium includes read only memory (ROM), random access memory (RAM), Disk storage medium, optical storage medium, flash storage medium, transmission signals with the form of electric, light, sound and other forms (such as earlier wave, infrared signal, digital signal).

The embodiments in the disclosure is described step by step, the important part of each embodiment mainly lies in the difference between other embodiments, the same or similar part between each embodiments may be referred to each other. The device embodiments are similar to the method embodiments, thusly the description is relatively simple, the related part may be referred to the parts of the method embodiments. The method for performing peak clipping to multiple carrier waves and device thereof are illustrated in the above, the examples in the disclosure are used to illustrate the disclosure, the embodiments above are only made for help understanding the method and the core concept of the disclosure. It is obvious for an ordinary skilled person in the art that modifications and variations could be made without departing from the scope and spirit of the claims as appended. For the scope of the disclosure, the inventive disclosure is illustrative rather than restrictive, and the scope of the disclosure is defined by the appended claims.

What is claimed is:

1. A method for performing peak clipping to multiple carrier waves, comprising:
   according to carrier wave number of configured multiple carrier waves, signal bandwidth and occupied bandwidth of each carrier wave, obtaining total signal bandwidth and total occupied bandwidth of the corresponding carrier waves;
   according to the total signal bandwidth and the total occupied bandwidth of the multiple carrier waves, generating a digital filter with set order, and obtaining filter coefficient of the digital filter;
   taking the filter coefficient as a peak clipping coefficient, and using the peak clipping coefficient to perform peak clipping to peak-to-average ratio signals of the carrier waves.

2. The method according to claim 1, wherein, the step of according to the total signal bandwidth and the total occupied bandwidth of the multiple carrier waves, generating a digital filter with set order, and obtaining filter coefficient of the digital filter comprises:
   taking quotient of the total signal bandwidth of the carrier waves divided by sampling frequency as a left frequency point of the digital filter, and taking the quotient of the total occupied bandwidth of the carrier waves divided by the sampling frequency as a right frequency point of the digital filter;
   according to the left frequency point and the right frequency point, generating the digital filter with set order.

3. The method according to claim 2, wherein, the step of according to the left frequency point and the right frequency point, generating the digital filter with set order comprises:
   using a first reduction coefficient to perform narrowing on the left frequency point and using a second reduction coefficient to perform narrowing on the right frequency point, respectively, to make a peak clipping noise bandwidth defined by the left frequency point and the right frequency point less than actual bandwidth;
   according to the narrowed left frequency point and right frequency point, generating the digital filter with set order.

4. The method according to claim 2, wherein, the step of according to the left frequency point and the right frequency point, generating the digital filter with set order comprises:
   taking the left frequency point, the right frequency point, and the set order as parameters, using firls function to generate finite impulse response (FIR) filter with set order.

5. The method according to claim 4, wherein, the step of obtaining the filter coefficient of the digital filter comprises:
   using kaiser window function to modify the generated FIR filter, and obtaining the filter coefficient of the modified digital filter.

6. A device or performing peak clipping to multiple carrier waves, comprising:
   a memory having instructions stored thereon;
   a processor configured to execute the instructions to perform peak clipping to multiple carrier waves, comprising:
   according to carrier wave number of configured multiple carrier waves, signal bandwidth and occupied bandwidth of each carrier wave, obtaining total signal bandwidth and the total occupied bandwidth of the corresponding carrier waves;
   according to the total signal bandwidth and the total occupied bandwidth of the multiple carrier waves, generating a digital filter with set order, and obtain filter coefficient of the digital filter;
   taking the filter coefficient as a peak clipping coefficient, and using the peak clipping coefficient to perform peak clipping to peak-to-average ratio signals of the carrier waves.

7. The device according to claim 6, wherein, the process is configured to perform:
   taking quotient of the total signal bandwidth of the carrier waves divided by the sampling frequency as a left frequency point of the digital filter, and takes the quotient of the total occupied bandwidth of the carrier waves divided by the sampling frequency as a right frequency point of the digital filter; and
   generating the digital filter with set order according to the left frequency point and the right frequency point.

8. The device according to claim 7, wherein, the processor is configured to perform:
   using the first reduction coefficient to perform narrowing on the left frequency point and uses the second reduction coefficient to perform narrowing on the right frequency point, respectively, to make a peak clipping noise bandwidth defined by the left frequency point and the right frequency point less than actual bandwidth; and
   generating the digital filter with set order according to the narrowed left frequency point and the right frequency point.

9. The device according to claim 7, wherein, the processor is configured to perform:
   taking the left frequency point, the right frequency point, and the set order as parameters, and using firls function to generate finite impulse response (FIR) filter with set order.

10. The device according to claim 9, wherein, the processor is configured to perform:
    using kaiser window function to modify the generated FIR filter, and obtaining the filter coefficient of the modified digital filter.

11. A non-transitory computer readable medium, having computer programs stored thereon that, when executed by one or more processors of a device or performing peak clipping to multiple carrier waves, cause the device to perform:
    according to carrier wave number of configured multiple carrier waves, signal bandwidth and occupied bandwidth of each carrier wave, obtaining total signal bandwidth and total occupied bandwidth of the corresponding carrier waves;
    according to the total signal bandwidth and the total occupied bandwidth of the multiple carrier waves, generating a digital filter with set order, and obtaining filter coefficient of the digital filter;
    taking the filter coefficient as a peak clipping coefficient, and using the peak clipping coefficient to perform peak clipping to the peak-to-average ratio signals of the carrier waves.

* * * * *